(12) United States Patent
Tadamasa et al.

(10) Patent No.: US 9,247,641 B2
(45) Date of Patent: Jan. 26, 2016

(54) SUBSTRATE WITH TRANSPARENT CONDUCTIVE LAYER AND ORGANIC ELECTROLUMINESCENCE DEVICE

(71) Applicant: Panasonic Corporation, Kadoma-shi, Osaka (JP)

(72) Inventors: Akihiko Tadamasa, Osaka (JP); Akira Tsujimoto, Nara (JP); Taisuke Matsui, Osaka (JP); Eri Yasuhara, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/375,339

(22) PCT Filed: Oct. 30, 2013

(86) PCT No.: PCT/JP2013/006410
§ 371 (c)(1),
(2) Date: Jul. 29, 2014

(87) PCT Pub. No.: WO2014/083767
PCT Pub. Date: Jun. 5, 2014

(65) Prior Publication Data
US 2015/0008416 A1  Jan. 8, 2015

(30) Foreign Application Priority Data

Nov. 29, 2012  (JP) ................. 2012-260779

(51) Int. Cl.
*H01L 51/00* (2006.01)
*H01L 51/52* (2006.01)
(Continued)

(52) U.S. Cl.
CPC .. *H05K 1/09* (2013.01); *H01B 1/22* (2013.01); *H01L 51/0023* (2013.01); *H01L 51/0096* (2013.01); *H01L 51/5215* (2013.01); *H01L 51/5234* (2013.01); *H01L 51/0027* (2013.01)

(58) Field of Classification Search
CPC ............ H01L 51/5234; H01L 51/5215; H01L 51/0096
See application file for complete search history.

(56) References Cited

U.S. PATENT DOCUMENTS 5,411,792 A * 5/1995 Yukinobu et al. ............. 428/212
6,108,062 A * 8/2000 Takeuchi et al. ............... 349/88
(Continued)

FOREIGN PATENT DOCUMENTS

| JP | 2002-266007 | 9/2002 |
| JP | 2004-149871 | 5/2004 |

(Continued)

OTHER PUBLICATIONS

Sun, et al., "Large-Scale Synthesis of Uniform Silver Nanowires through a Soft, Self-Seeding, Polyol Process". Advanced Materials, vol. 14, No. 11, Jun. 2002, pp. 833-837.
(Continued)

*Primary Examiner* — Ida M Soward
(74) *Attorney, Agent, or Firm* — Hamre, Schumann, Mueller & Larson, P.C.

(57) ABSTRACT

A substrate with a transparent conductive layer (1) of the present invention includes a substrate (11) and a transparent conductive layer (12) disposed on the substrate (11). The transparent conductive layer (12) has a conductive region (13) and a non-conductive region (14). The conductive region (13) contains conductive fine particles (121) and a resin matrix (122). The non-conductive region (14) contains conductive fine particles (123) and the resin matrix (122). A haze value in the non-conductive region (14) is larger than a haze value in the conductive region (13).

5 Claims, 3 Drawing Sheets

(51) Int. Cl.
*H05K 1/09* (2006.01)
*H01B 1/22* (2006.01)

(56) References Cited

U.S. PATENT DOCUMENTS

| | | | |
|---|---|---|---|
| 6,858,318 B2 | 2/2005 | Kogiso et al. | |
| 8,256,908 B2* | 9/2012 | Inoue et al. | 359/601 |
| 8,269,108 B2 | 9/2012 | Kunishi et al. | |
| 8,313,201 B2* | 11/2012 | Wakizaka et al. | 359/601 |
| 2004/0043210 A1* | 3/2004 | Seto et al. | 428/331 |
| 2007/0114523 A1 | 5/2007 | Oumi et al. | |
| 2008/0151376 A1* | 6/2008 | Suzuki et al. | 359/599 |
| 2009/0202819 A1* | 8/2009 | Asahi et al. | 428/336 |
| 2009/0268299 A1* | 10/2009 | Furui et al. | 359/601 |
| 2009/0278440 A1* | 11/2009 | Yukinobu et al. | 313/498 |
| 2010/0044073 A1* | 2/2010 | Yasuda et al. | 174/126.1 |
| 2010/0072052 A1* | 3/2010 | Yasuda | 200/512 |
| 2010/0177397 A1* | 7/2010 | Kamiyama et al. | 359/609 |
| 2010/0315715 A1* | 12/2010 | Oki et al. | 359/580 |
| 2012/0138937 A1* | 6/2012 | Jo et al. | 257/59 |
| 2014/0085551 A1* | 3/2014 | Koo et al. | 349/12 |
| 2014/0132883 A1* | 5/2014 | Roberts et al. | 349/62 |
| 2014/0211316 A1* | 7/2014 | Furui et al. | 359/599 |
| 2015/0076106 A1* | 3/2015 | Pellerite et al. | 216/13 |
| 2015/0129286 A1* | 5/2015 | Srinivas et al. | 174/253 |

FOREIGN PATENT DOCUMENTS

| | | |
|---|---|---|
| JP | 2006-233252 | 9/2006 |
| JP | 2008-055479 | 3/2008 |
| JP | 2009-505358 | 2/2009 |
| JP | 2009-510696 | 3/2009 |
| JP | 2010-044968 | 2/2010 |
| JP | 2012-209030 | 10/2010 |
| JP | 2010-287540 | 12/2010 |
| JP | 2011-070820 | 4/2011 |
| JP | 2011-258578 | 12/2011 |
| JP | 2012-028025 | 2/2012 |
| WO | 2007/022226 | 2/2007 |
| WO | 2007/041116 | 4/2007 |

OTHER PUBLICATIONS

Sun, et al., "Uniform Silver Nanowires Synthesis by Reducing $AgNO_3$ with Ethylene Glycol in the Presence of Seeds and Poly(Vinyl Pyrrolidone)", Chemistry of Materials, vol. 14, 2002, pp. 4736-4745.

Jiu, et al., "Preparation of AG nanorods with high yield by polyol process", Materials Chemistry and Physics, vol. 114, 2009, pp. 333-338.

Search Report issued in corresponding Chinese Application No. 201380006477.4, Sep. 29, 2015, 3 pages.

* cited by examiner

SUBSTRATE WITH TRANSPARENT CONDUCTIVE LAYER AND ORGANIC ELECTROLUMINESCENCE DEVICE

TECHNICAL FIELD

The present invention relates to a substrate with a transparent conductive layer and an organic electroluminescence device using the substrate.

BACKGROUND ART

Organic electroluminescence (referred to as "organic EL" hereinafter) is expected to be applied as surface emission to main lighting and liquid crystal display backlight. A common organic EL device has a multi-layer structure composed of a transparent substrate, a transparent electrode, a light-emitting layer, and a reflecting electrode. Light from a light-emitting source (light-emitting layer) travels through the transparent electrode and the transparent substrate, is output from the atmosphere-facing surface of the transparent substrate, and is thus extracted to the atmosphere (the outside of the organic EL device). Specifically, due to the difference in refractive index between the transparent substrate and the transparent electrode, about 45% of the light is lost by total reflection at the interface between the transparent substrate and the transparent electrode (substrate-transparent electrode interface) in the form of light propagated in the transparent electrode or light propagated laterally along the substrate-transparent electrode interface. This phenomenon is one of the major factors for low efficiency in the extraction of emitted light to the outside. Various attempts have been conventionally made to avoid such a phenomenon and thus increase the efficiency in the extraction of light from the exposed surface (atmosphere-facing surface) of the transparent substrate.

In general, ITO (Indium Tin Oxide) has been used in transparent electrodes for use in organic EL devices. Recently, however, ultrafine metal fibers such as metal nanofibers and metal nanowires have often been used in transparent electrodes as an alternative to ITO which is a rare metal and the depletion of whose source is causing concern. Various methods have been proposed as methods for patterning transparent electrodes in which such ultrafine metal fibers are used. For example, a patterning method is known in which a transparent electrode containing ultrafine metal fibers is formed on a surface of a transparent substrate, and unnecessary portions are removed by photoetching or laser processing to form non-conductive regions (Patent Literature 1 to 3).

CITATION LIST

Patent Literature

Patent Literature 1: JP 2010-44968 A
Patent Literature 2: JP 2011-258578 A
Patent Literature 3: JP 2012-28025 A

Non Patent Literature

Non Patent Literature 1: Adv. Mater. 2002, 14, P833 to 837
Non Patent Literature 2: Chem. Mater. 2002, 14, P4736 to 4745
Non Patent Literature 3: Materials Chemistry and Physics 2009, vol. 114, p 333 to 338

SUMMARY OF INVENTION

Technical Problem

The present invention aims to provide a substrate with a transparent conductive layer that includes a transparent conductive layer in which ultrafine metal fibers are used and that can be used, for example, as a transparent electrode, the substrate with the transparent conductive layer capable of improving the light extraction efficiency by allowing light propagated laterally (in the planar direction) in the transparent conductive layer to be extracted to the outside.

Solution to Problem

A substrate with a transparent conductive layer of the present invention includes a substrate and a transparent conductive layer disposed on the substrate. The transparent conductive layer has a conductive region and a non-conductive region. The conductive region and the non-conductive region each contain conductive fine particles and a resin matrix. A haze value in the non-conductive region is larger than a haze value in the conductive region.

Advantageous Effects of Invention

In the substrate with the transparent conductive layer of the present invention, the transparent conductive layer includes a non-conductive region having a large haze value. Therefore, light propagated laterally in the transparent conductive layer is scattered in the non-conductive region and is extracted to the outside. Consequently, using the substrate with the transparent conductive layer of the present invention can improve light extraction efficiency.

DESCRIPTION OF EMBODIMENTS

For conventional transparent electrodes as described in "BACKGROUND ART", which are formed by patterning a transparent electrode containing ultrafine metal fibers and are used in organic EL devices, the present inventors have found, by diligent study, that there is room for further improvement in light extraction efficiency.

Figure 3A:
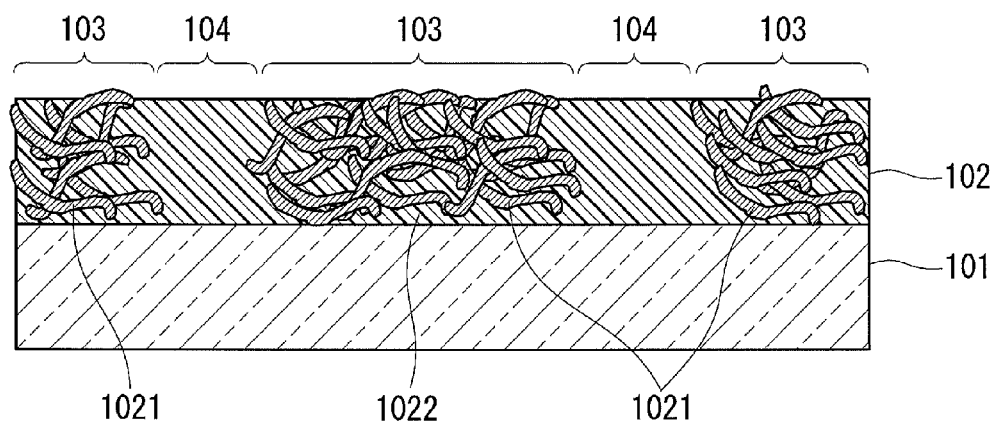
FIG. 3A and FIG. 3B are cross-sectional views of substrates with transparent conductive layers of conventional examples.
Figure 3B:
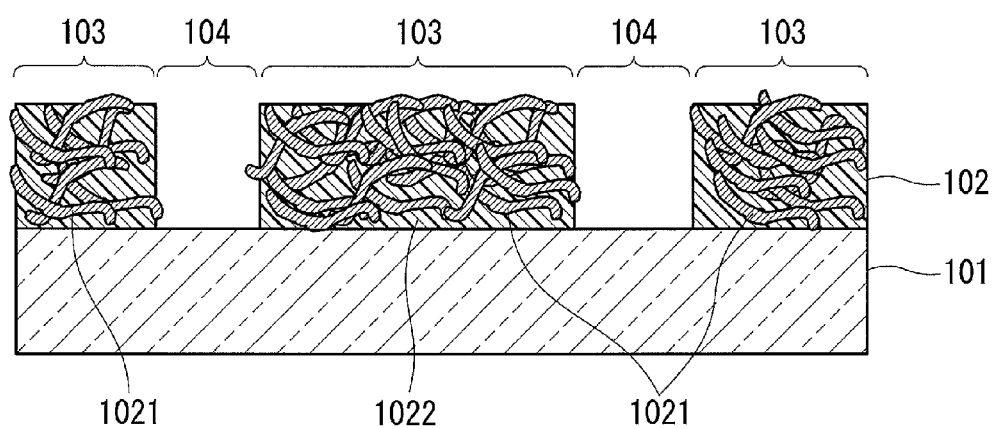

FIGS. 3A and 3B show conventional methods for patterning of transparent conductive layers in which ultrafine metal fibers are used. In conventional patterning methods described in Patent Literature 1 to 3, as shown, for example, in FIG. 3A, non-conductive regions 104 are formed by tearing or removing ultrafine metal fibers 1021 contained in a transparent conductive layer 102 disposed on a substrate 101. The ultrafine metal fibers 1021 are not present or, if present, are broken in the non-conductive regions 104, which are therefore insulated. In another example of conventional patterning methods, as shown in FIG. 3B, the non-conductive regions 104 are formed by removing the ultrafine metal fibers 1021 and a matrix resin 1022. In the case of the transparent conductive layer 102 formed by such a patterning method, there is a large amount of light that is absorbed by the transparent conductive layer 102 without being extracted to the outside due to the light being propagated laterally in the transparent conductive layer 102 from the conductive regions 103 to the non-conductive regions 104.

By conducting various studies focusing on light propagated laterally in the transparent conductive layer, the present inventors have succeeded in providing a substrate with a transparent conductive layer of the present invention that achieves an improved light extraction efficiency by allowing the light propagated laterally in the transparent conductive layer to be scattered in a non-conductive region. Furthermore, the present inventors have also succeeded in providing an organic EL device having an improved light extraction efficiency by using the substrate with the transparent conductive layer of the present invention.

A first aspect of the present invention provides a substrate with a transparent conductive layer that includes a substrate and a transparent conductive layer disposed on the substrate. The transparent conductive layer has a conductive region and a non-conductive region. The conductive region and the non-conductive region each contain conductive fine particles and a resin matrix. A haze value in the non-conductive region is larger than a haze value in the conductive region.

In the substrate with the transparent conductive layer according to the first aspect, light propagated laterally in the transparent conductive layer from the conductive region to the non-conductive region having a higher haze value than the conductive region can be extracted to the outside by scattering the light in the non-conductive region and thus changing the traveling direction of the light. Therefore, using the substrate with the transparent conductive layer according to the first aspect can improve light extraction efficiency.

A second aspect of the present invention provides the substrate with the transparent conductive layer as set forth in the first aspect, wherein the conductive fine particles in the conductive region and the conductive fine particles in the non-conductive region are made of the same material, and the conductive fine particles in the non-conductive region have a smaller aspect ratio than the conductive fine particles in the conductive region.

In the substrate with the transparent conductive layer according to the second aspect, the conductive fine particles in the conductive region and the conductive fine particles in the non-conductive region are made of the same material. Therefore, according to the second aspect, the non-conductive region can be formed, for example, as follows: a film containing conductive fine particles and a resin matrix is fabricated, and the conductive fine particles are converted into conductive fine particles having a smaller aspect ratio by a simple process such as applying heat or light from a laser or the like to the conductive fine particles present in a portion of the film where the non-conductive region is to be formed.

A third aspect of the present invention provides the substrate with the transparent conductive layer as set forth in the first or second aspect, wherein a percentage of a volume occupied by the conductive fine particles in the non-conductive region to a volume occupied by the conductive fine particles in the conductive region is 1% or more and 50% or less.

In the substrate with the transparent conductive layer according to the third aspect, light propagated to the non-conductive region is more likely to be scattered. Therefore, a larger amount of light can be extracted to the outside, with the result that the light extraction efficiency can be further improved.

A fourth aspect of the present invention provides the substrate with the transparent conductive layer as set forth in any one of the first to third aspects, wherein the conductive fine particles in the conductive region are silver nanowires.

In the case of the substrate with the transparent conductive layer according to the fourth aspect, it is possible to obtain a transparent conductive layer having higher transparency and higher electrical conductivity than in the case of using other types of metal nanowires.

A fifth aspect of the present invention provides an organic EL device including: the substrate with the transparent conductive layer according to any one of the first to fourth aspects; an electrode disposed opposite the transparent conductive layer formed on the substrate; and a light-emitting layer disposed between the transparent conductive layer and the electrode.

In the organic EL device according to the fifth aspect, light emitted from the light-emitting layer and propagated laterally in the transparent conductive layer from a conductive region to a non-conductive region having a higher haze value than the conductive region can be extracted to the outside by scattering the light in the non-conductive region and thus changing the traveling direction of the light. Therefore, according to the fifth aspect, an organic EL device having an improved light extraction efficiency can be achieved.

Hereinafter, embodiments of the present invention will be described with reference to the drawings.

First Embodiment

Substrate with Transparent Conductive Layer

Overall Configuration

Figure 1:
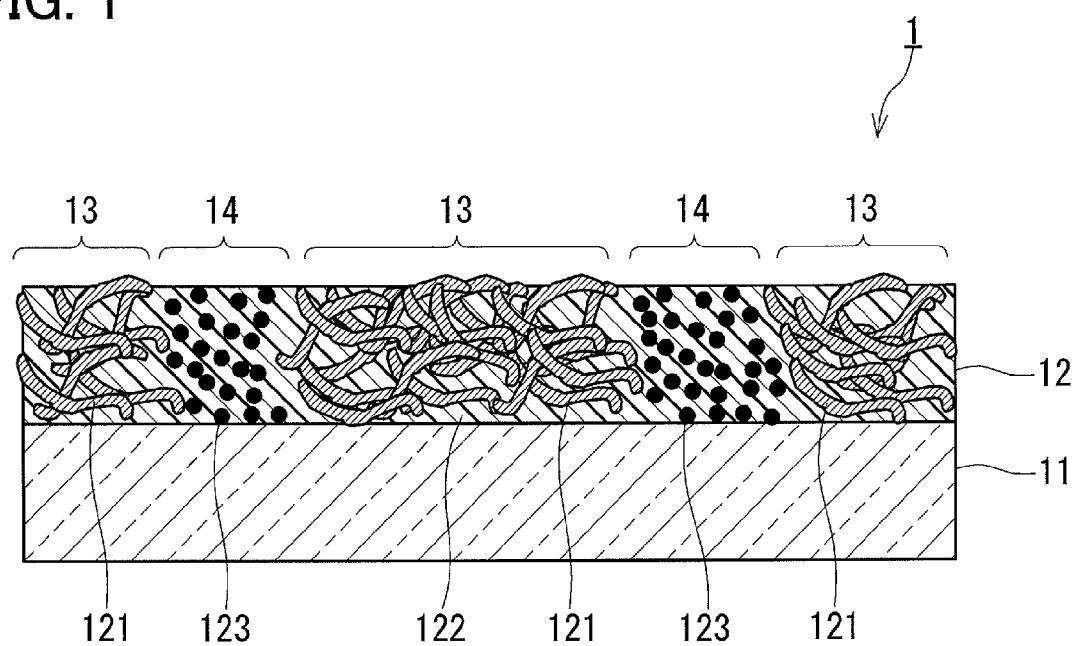
FIG. 1 is a cross-sectional view of a substrate with a transparent conductive layer of an embodiment of the present invention.

FIG. 1 is a cross-sectional view showing an example of a substrate with a transparent conductive layer of a first embodiment of the present invention. As shown in FIG. 1, the substrate with the transparent conductive layer 1 of the present embodiment is formed by disposing a transparent conductive layer 12 on a substrate 11. The transparent conductive layer 12 has conductive regions 13 having electrical conductivity and non-conductive regions 14 that are insulated. The conductive region 12 contains first conductive fine particles 121 and a resin matrix 122. The non-conductive region 14 contains second conductive fine particles 123 and the resin matrix 122. In the substrate with the transparent conductive layer of the present invention, the conductive region is a region having an electrical resistance of 500 Ω/sq. or less in terms of sheet resistance, and the non-conductive region is a region having an electrical resistance of 10000 Ω/sq. or more in terms of sheet resistance.

Substrate 11

The form, structure, size, and the like, of the substrate 11 are not particularly limited, and can be selected as appropriate depending on the purpose. Examples of the form of the substrate 11 include the form of a flat plate, the form of a sheet, and the form of a film. The structure of the substrate 11 may be, for example, a single-layer structure or a multi-layer structure, and can be selected as appropriate. The material of the substrate 11 is not particularly limited either. Either an inorganic material or an organic material can be suitably used.

Examples of the inorganic material forming the substrate 11 include glass, quartz, and silicone. Examples of the organic material forming the substrate 11 include acetate resins such as triacetyl cellulose (TAC), polyester resins such as polyethylene terephthalate (PET), polyethersulfone resins, polysulfone resins, polycarbonate resins, polyamide resins, polyimide resins, polyolefin resins, acrylic resins, polynorbornene resins, cellulose resins, polyarylate resins, polystyrene resins, polyvinyl alcohol resins, polyvinyl chloride resins, polyvinylidene chloride resins, and polyacrylic resins. One of these may be used alone, or two or more thereof may be used in combination.

Transparent Conductive Layer 12

The transparent conductive layer 12 is transparent, and has the conductive regions 13 and the non-conductive regions 14 as described above. The conductive regions 12 can be formed using a material containing the first conductive fine particles 121 and the resin matrix 122. The non-conductive regions 14 can be formed using a material containing the second conductive fine particles 123 and the resin matrix 122.

First Conductive Fine Particle 121

Fibrous conductive fine particles having a large aspect ratio (e.g., an aspect ratio of 10 or more and 10000 or less) are used as the first conductive fine particles 121. For example, ultrafine metal fibers such as metal nanowires can be used. The ultrafine metal fibers used may be those arbitrarily selected. The means for producing the ultrafine metal fibers is not particularly limited and, for example, a commonly-known means such as a liquid-phase method or a gas-phase method can be used. The details of the production method are not particularly limited either, and a commonly-known production method can be used. Examples of production methods of Ag nanowires (silver nanowires) include production methods described in Non Patent Literature 1 "Adv. Mater. 2002, 14, P833 to 837", Non Patent Literature 2 "Chem. Mater. 2002, 14, P4736 to 4745", Non Patent Literature 3 "Materials Chemistry and Physics 2009, vol. 114, p 333 to 338, 'Preparation of Ag nanorods with high yield by polyol process'", and JP 2009-505358 T. Examples of production methods of Au nanowires (gold nanowires) include a production method described in JP 2006-233252 A. Examples of production methods of Cu nanowires (copper nanowires) include a production method described in JP 2002-266007 A. Examples of production methods of Co nanowires (cobalt nanowires) include a production method described in JP 2004-149871 A. In particular, the Ag nanowire production methods reported in Adv. Mater. and Chem. Mater. mentioned above can be desirably applied as a method for producing the metal nanowires used in the present embodiment, because the production methods are capable of producing a large amount of Ag nanowires in an aqueous system in a simplified manner and because silver has the highest volume resistivity among metals. That is, it is desirable that the metal nanowires be Ag nanowires. In this case, it is possible to obtain the transparent conductive layer 12 that has higher transparency and higher electrical conductivity than in the case of using other types of metal nanowires.

The average diameter of the metal nanowires is desirably 200 nm or less from the standpoint of transparency, and is desirably 10 nm or more from the standpoint of electrical conductivity. The average diameter being 200 nm or less is desirable because a decrease in light transmittance can be prevented. The average diameter being 10 nm or more is desirable because the function as a conductive material can be expressed to a significant extent and because the larger the average diameter is, the higher the electrical conductivity is. Therefore, the average diameter is more desirably 20 to 150 nm and most desirably 40 to 150 nm. The average length of the metal nanowires is desirably 1 µm or more from the standpoint of electrical conductivity, and is desirably 100 µm or less from the standpoint of influence of aggregation on the transparency. The average length is more desirably 1 to 50 µm, and most desirably 3 to 50 µm. The average diameter and the average length of the metal nanowires can be determined by taking an electron microscope photograph of a sufficient number of metal nanowires with a SEM or a TEM and by calculating arithmetic averages of the measured values obtained from the respective images of the metal nanowires. Although ideally the lengths of the metal nanowires straightened should be determined, the metal nanowires are curved in many actual cases. Therefore, the length of each metal nanowire is determined by calculating a projected diameter and a projected area of the metal nanowire from an electron microscope photograph using an image analysis system and by calculating the length assuming that the nanowire has a cylindrical shape (Length=Projected area/Projected diameter). The number of the metal nanowires subjected to the measurement is desirably at least 100. It is more desirable that 300 or more metal nanowires be subjected to the measurement.

Second Conductive Fine Particle 123

Fine particles having a smaller aspect ratio than the first conductive fine particles 121 can be used as the second conductive fine particles 123. It is desirable that the material of the second conductive fine particles 123 be the same as the material of the first conductive fine particles 121. In that case, the non-conductive regions 14 can be formed as follows: a film containing conductive fine particles that are to serve as the first conductive fine particles 121 and second conductive fine particles 123 is formed, and some of the conductive fine particles are then formed into the shape of the second conductive fine particles 123 by applying light or heat to the portions to be insulated, that is, the portions to be formed as the non-conductive regions 14. The portions to be formed as the conductive regions 13 are not subjected to such treatment as light irradiation, and the conductive fine particles in the portions can be used as the first conductive fine particles 121 without any change. In the case of forming the non-conductive regions 14 by such a method, it is desirable to use an infrared laser. An infrared laser emits light having wavelengths at which the resin component shows high transmittance and at which the conductive fine particles show relatively high absorbance. Therefore, energy can be selectively imparted to the conductive fine particles without sublimation of the resin component. In addition, the resin component acts to limit the phenomenon of sublimation and dissipation of the conductive fine particles. That is, the conductive fine particles are less likely to sublimate and dissipate into the atmosphere by virtue of the presence of the resin component. Therefore, it can be thought that the conductive fine particles in the portions subjected to light irradiation become much smaller particles and remain in the portions subjected to irradiation. By use of an infrared laser, the structure of the conductive regions 13 and the non-conductive regions 14 as shown in FIG. 1 can easily be fabricated at arbitrary positions with high positional accuracy.

The volume of the second conductive fine particle 123 is desirably 0.75 nm$^3$ or more from the standpoint of optical properties, and is desirably 200,000 nm³ or less from the standpoint of insulating properties. The volume of the second conductive fine particle 123 being 0.75 nm³ or more is desirable because absorption of short-wavelength light is reduced and, as a result, a decrease in the reflection rate and scattering rate of propagating light can be prevented. From the standpoint of insulating properties, the volume of the second conductive fine particle 123 being 200,000 nm³ or less is desirable because sufficient insulating properties can be ensured.

It is desirable that the percentage of the volume occupied by the second conductive fine particles 123 in the non-conductive region 14 to the volume occupied by the first conductive fine particles 121 in the conductive region 13 be 1% or more and 50% or less. With this configuration, light having been propagated to the non-conductive region 14 is more likely to scatter, and thus a larger amount of light can be extracted to the outside, with the result that the light extraction efficiency can be further improved.

Resin Matrix 122

For example, the following can be used as the resin matrix 122: cellulose resins; silicone resins; fluorine resins; acrylic resins; polyethylene resins; polypropylene resins; polyethylene terephthalate resins; polymethylmethacrylate resins; polystyrene resins; polyethersulfone resins; polyarylate resins; polycarbonate resins; polyurethane resins; polyacrylonitrile resins; polyvinyl acetal resins; polyamide resins; polyimide resins; diallyl phthalate resins; polyvinyl chloride resins; polyvinylidene chloride resins; polyvinyl acetate resins; other thermoplastic resins; and copolymers of two or more types of monomers selected from those constituting the above-mentioned resins.

Method for Producing Substrate with Transparent Conductive Layer

An example of the method for producing the substrate with the transparent conductive layer will be described for the case where the first conductive fine particles 121 and the second conductive fine particles 123 are made of the same material.

The substrate 11 and a material for forming the transparent conductive layer are prepared. The substrate 11 that can be used is as described above. The material for forming the transparent conductive layer includes: conductive fine particles that are to serve as the first conductive fine particles 121 and second conductive fine particles 123; and a resin material that is to serve as the resin matrix 122. Examples of usable conductive fine particles and resin materials are as mentioned above.

The material for forming the transparent conductive layer is applied to one surface of the substrate 11. The resulting coating is dried, for example, at 40 to 100° C. for 1 to 30 minutes, and is then heated, for example, at 100 to 300° C. for 1 to 60 minutes, so that a film including conductive fine particles and a resin matrix is formed. The method for application of the material for forming the transparent conductive layer is not particularly limited. For example, the method can be selected from: various common application methods such as brush coating, spray coating, dipping (dip coating), roll coating, gravure coating, microgravure coating, flow coating, curtain coating, knife coating, spin coating, table coating, sheet coating, leaf sheet coating, die coating, bar coating, reverse coating, and cap coating; and methods of applying the material in a pattern using an inkjet coater. The thickness of the thus-formed film including the conductive fine particles and the resin matrix is desirably 20 to 1000 nm.

Next, the film including the conductive fine particles and the resin matrix is patterned into the conductive regions 13 and the non-conductive regions 14 to form the transparent conductive layer 12. The method described above in [Second conductive fine particle 123] is suitably used as the patterning method. When laser light is used, the use of an infrared laser is desirable, and the irradiation energy is desirably about 0.3 to 5 J/cm².

In the case where the first conductive fine particles 121 and the second conductive fine particles 123 are made of different materials, the conductive regions 13 and the non-conductive regions 14 are formed separately. For example, the following materials are prepared: a material for forming the conductive regions that includes the first conductive fine particles 121 and a resin material that is to serve as the resin matrix 122; and a material for forming the non-conductive regions that includes the second conductive fine particles 123 and a resin material that is to serve as the resin matrix 122. The material for forming the conductive regions is applied onto a surface of the substrate 11, and the material is dried and heated to form a film. Next, portions of the obtained film are removed from the sites where the non-conductive regions 14 are to be formed, and films are formed in the sites using the material for forming the non-conductive regions. In this manner, the transparent conductive layer 12 constituted by the conductive regions 13 and the non-conductive regions 14 can be produced. In the case of this method, the regions formed first may be the non-conductive regions 14.

Second Embodiment

Organic EL Device

Overall Configuration

Figure 2:
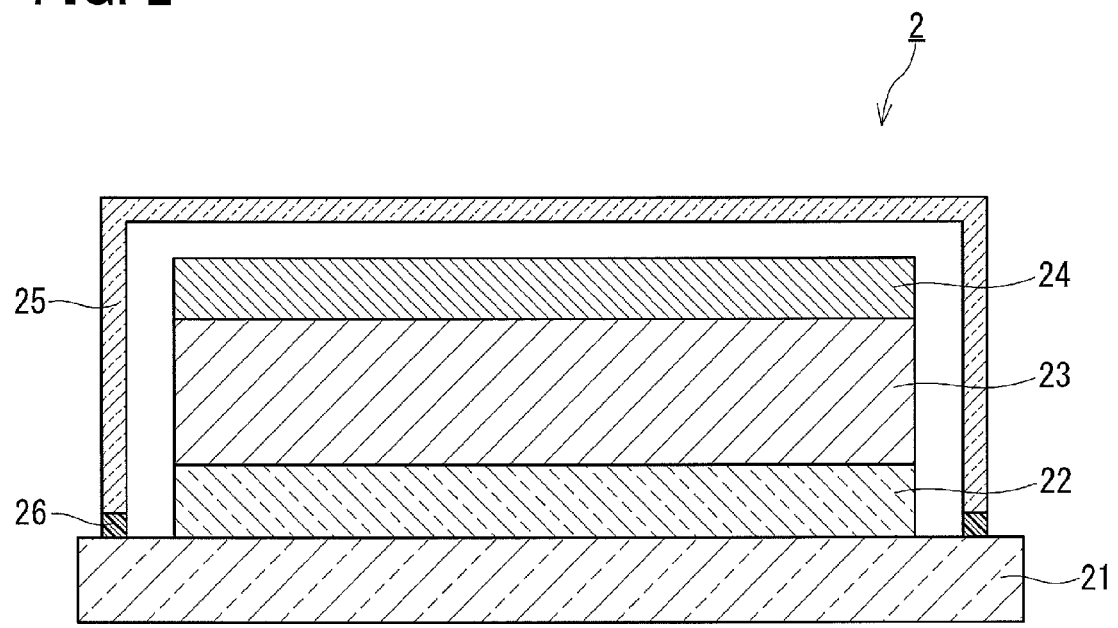
FIG. 2 shows a cross-section of an organic EL device of an embodiment of the present invention.

FIG. 2 is a cross-sectional view showing an example of an organic EL device of a second embodiment of the present invention. In the organic EL device 2 of the present embodiment shown in FIG. 2, the substrate with the transparent conductive layer described in the first embodiment is used. The organic EL device 2 includes a stack composed of a substrate 21, a transparent electrode 22 disposed on the substrate 21, a light-emitting layer 23 disposed on the transparent electrode 22, and an electrode 24 disposed on the light-emitting layer 23. The substrate with the transparent conductive layer 1 described in the first embodiment (see FIG. 1) can be used as the substrate 21 and the transparent electrode 22. The substrate 21 corresponds to the substrate 11, and the transparent electrode 22 corresponds to the transparent conductive layer 12.

When the transparent electrode 22 is a positive electrode, a hole transport layer (positive hole transport layer) (which is not shown in the drawings) may be provided between the transparent electrode 22 and the light-emitting layer 23. The electrode 24 is provided on a surface of the light-emitting layer 23. In this case, the electrode 24 acts as an negative electrode. An electron transport layer and an electron injection layer (both of which are not shown in the drawings) may be provided between the light-emitting layer 23 and the electrode 24 in such a manner that the electron transport layer and the electron injection layer are arranged in this order from the light-emitting layer 23.

Conversely, when the transparent electrode 22 is a negative electrode, an electron transport layer and an electron injection layer (both of which are not shown in the drawings) may be provided between the transparent electrode 22 and the light-emitting layer 23 in such a manner that the electron transport layer and the electron injection layer are arranged in this order from the light-emitting layer 23. The electrode 24 is disposed on a surface of the light-emitting layer 23. In this case, the electrode 24 acts as a positive electrode. A hole transport layer and a hole injection layer (both of which are not shown in the drawings) may be formed between the light-emitting layer 23 and the electrode 24 by stacking the hole transport layer and the hole injection layer in this order from the light-emitting layer 23.

Light-Emitting Layer 23

Examples of the material of the light-emitting layer 23 include aluminum-quinolinol complex (tris(8-hydroxyquinoline)aluminum), polyparaphenylenevinylene derivatives, polythiophene derivatives, polyparaphenylene derivatives, polysilane derivatives, polyacetylene derivatives, polyfluorene derivatives, polyvinyl carbazole derivatives, dye materials, and polymerized products of metal complex-based luminescent materials. Examples of the material further include anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complexes, tris(8-hydroxyquinolinato)aluminum complex, tris(4-methyl-8-quinolinato)aluminum complex, tris(5-phenyl-8-quinolinato)aluminum complex, aminoquinoline metal complexes, benzoquinoline metal complexes, tri(p-terphenyl-4-yl)amine, pyran, quinacridone, rubrene, and derivatives thereof. Examples of the material further include 1-aryl-2,5-di(2-thienyl)pyrrole derivatives, distyrylbenzene derivatives, styrylarylene derivatives, and styrylamine derivatives. Examples of the material further include compounds having a group constituted by any of these luminescent compounds as a part of the molecule. As well as fluorescent dye-derived compounds as typified by the above-mentioned compounds, so-called phosphorescent materials, as exemplified by luminescent materials such as iridium complexes, osmium complexes, platinum complexes, and europium complexes, can also be suitably used, and compounds or polymers whose molecule includes any of these luminescent complexes can also be suitably used. The above-mentioned materials can be selectively used as necessary. It is desirable that the light-emitting layer 23 be formed as a film by a wet process such as an application method (e.g., a spin coating method, a spray coating method, a die coating method, a gravure printing method, or a screen printing method). The method for forming the light-emitting layer 23 as a film is not limited to application methods. For example, the light-emitting layer 23 may be formed as a film by a dry process such as a vacuum deposition method or a transfer method.

Electron Injection Layer

For example, metal fluorides such as lithium fluoride and magnesium fluoride, metal halides such as metal chlorides as typified by sodium chloride and magnesium chloride, and oxides of titanium, zinc, magnesium, calcium, barium, and strontium, can be used as the material of the electron injection layer. In the case of using any of these materials, the electron injection layer can be formed by a vacuum deposition method. Alternatively, for example, an organic semiconductor material mixed with a dopant (an alkali metal or the like) for facilitating electron injection can be used as the material of the electron injection layer. In the case of using such a material, the electron injection layer can be formed by an application method.

Electron Transport Layer

The material of the electron transport layer can be selected from among compounds having electron transport properties. This type of compounds include, but not limited to: metal complexes known as electron-transporting materials, such as Alq3; and compounds having a hetero ring, such as phenanthroline derivatives, pyridine derivatives, tetrazine derivatives, and oxadiazole derivatives. Any commonly-known electron-transporting materials can be used.

Hole Transport Layer

As the material of the hole transport layer, a low-molecular material or a high-molecular material having a low LUMO (Lowest Unoccupied Molecular Orbital) level can be used. Examples of the material include, but not limited to, aromatic amine-containing polymers, as exemplified by polyvinyl carbazole (PVCz) and polyarylene derivatives, such as polypyridine and polyaniline, which have an aromatic amine in their main chain or side chain. As the material of the hole transport layer, for example, N,N'-diphenyl-N,N'-bis-3-methyl-phenyl-1,1'-diphenyl-4,4'-diamine, 4,4'-bis[N-(naphthyl)-N-phenylamino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), Spiro-NPD, spiro-TPD, spiro-TAD, TNB, or the like, can be used.

Hole Injection Layer

Examples of the material of the hole injection layer include organic materials containing thiophene, triphenylmethane, hydrazoline, amylamine, aniline, hydrazone, stilbene, triphenylamine, or the like. Examples of such organic materials are aromatic amine derivatives such as polyvinyl carbazole, polyethylenedioxythiophene:polystyrene sulfonate (PEDOT:PSS), and TPD. These materials may be used alone or two or more thereof may be used in combination. Such a hole injection layer can be formed as a film by a wet process such as an application method (a spin coating method, a spray coating method, a die coating method, a gravure printing method, or the like).

Electrode 24

The electrode 24 may be either light-reflective or transparent. It is desirable that a material made of a low-work-function metal, alloy, electrically-conductive compound, or a mixture thereof, be used as the material of the electrode 24. In order to avoid a too large difference between the work function and the LUMO level, it is desirable to use a material having a work function of 1.9 eV or more and 5 eV or less. Specific examples of the material include: aluminum; silver; magnesium; gold; copper; chromium; molybdenum; palladium; tin; and alloys thereof with other metals, such as a magnesium-silver mixture, a magnesium-indium mixture, and an aluminum-lithium alloy. In addition, a metal, a metal oxide, and a composite body of a metal or a metal oxide and another metal such as a multi-layer film composed of an aluminum oxide thin film and an aluminum thin film, can also be used. Metals that have a low resistivity and have a high reflectivity for light emitted from the light-emitting layer 23 are desirable, and aluminum or silver is desirable.

The thickness of the hole injection layer can be set to 20 to 100 nm, the thickness of the hole transport layer can be set to 20 to 60 nm, the thickness of the light-emitting layer 23 can be set to 20 to 80 nm, the thickness of the electron transport layer can be set to 20 to 60 nm, the thickness of the electron injection layer can be set to 0.5 to 10 nm, and the thickness between the transparent electrode 22 and the electrode 24 can be set to 80 to 260 nm. However, the thicknesses are not limited to these ranges.

Method for Producing Organic EL Device 2

The substrate with the transparent conductive layer 1 of the first embodiment (see FIG. 1) is used as the substrate 21 and the transparent electrode 22. The light-emitting layer 23, and other layers provided as necessary such as the electron injection layer, the electron transport layer, the hole transport layer and/or the hole injection layer, are formed on the transparent conductive layer 12 of the substrate with the transparent conductive layer 1. These layers can be fabricated by commonly-known methods used for producing common organic EL devices.

Next, in an atmosphere shielded from external air, a seal cap 25 is attached with a sealing agent 26 to the substrate 21 so as to cover and seal the whole of the stack including the transparent electrode 22, the light-emitting layer 23, and the electrode 24. Thus, the organic EL device 2 shown in FIG. 2 can be produced. Although not shown in the drawings, a part of the transparent electrode 22 and a part of the electrode 24 are drawn out from the inside to the outside of the seal cap 25. A transparent seal cap, such as that which is made of glass, can be used as the seal cap 25 and, in addition, a seal cap whose inner surface have light reflectivity can also be used. A water-absorbing agent may be attached to the inner surface of the seal cap 25. A sealing agent made of an ultraviolet-cured resin, or the like, can be used as the sealing agent 26.

The organic EL device 2 formed as described above uses the substrate with the transparent conductive layer 1 of the first embodiment as the component (the substrate 21 and the transparent electrode 22) on the side from which light is extracted. Therefore, the light propagating in the transparent electrode 22 can be scattered in the non-conductive regions to change the propagation direction of the light. Accordingly, it can be expected that the amount of light extracted through the substrate is increased and the light extraction efficiency is thereby improved, compared to those in conventional devices.

EXAMPLES

Example 1

Silver nanowires (average diameter: 50 nm, average length: 5 µm) serving as conductive fine particles were prepared based on Non Patent Literature 3 "Materials Chemistry and Physics 2009, vol. 114, p 333 to 338, 'Preparation of Ag nanorods with high yield by polyol process'".

The above silver nanowires (3 parts by mass), a cellulose resin ("SM" manufactured by Shin-Etsu Chemical Co., Ltd.) (1 part by mass), and water were mixed to prepare a transparent conductive layer-forming material A having a solid content of 4.0 mass %.

A 40-mm square alkali-free glass sheet ("No. 1737" manufactured by Corning Incorporated and having a refractive index of 1.50 to 1.53 at a wavelength of 500 nm) was used as a substrate. The material A was applied to a surface of the substrate by a spin coating method, and dried and cured by heating at 100° C. for 5 minutes to form a transparent conductive layer having a thickness of 100 nm. Next, a pattern of a conductive region and a non-conductive region was formed by applying scanning light with a pulse energy intensity of 0.6 J/cm$^2$ by pulse irradiation using a 1050-nm wavelength fiber laser in such a manner that the conductive region had the shape of a 2-mm wide strip and the non-conductive region was formed on either side of the conductive region. Thus, a substrate with a transparent conductive layer was produced which had the 2-mm wide strip-shaped conductive region provided in a central portion of the transparent conductive layer and which had the non-conductive region provided on either side of the conductive region.

Next, an organic EL device was produced using the obtained substrate with the transparent conductive layer. The transparent conductive layer formed on the substrate was used as a transparent electrode (positive electrode) of the organic EL device. N,N'-diphenyl-N,N'-bis-3-methyl-phenyl-1,1'-diphenyl-4,4'-diamine (manufactured by DOJINDO LABORATORIES) was vacuum-deposited on the surface of the positive electrode to form a hole transport layer having a thickness of 50 nm. A quinolinol aluminum complex (tris(8-hydroxyquinoline)aluminum manufactured by DOJINDO LABORATORIES) was vacuum-deposited on the surface of the hole transport layer to form a light-emitting layer having a thickness of 50 nm.

Next, lithium fluoride was vacuum-deposited on the surface of the light-emitting layer to form an electron injection layer having a thickness of 5 nm. An electrode (negative electrode) was formed on the surface of the electron injection layer. This negative electrode was formed by vacuum-depositing aluminum (manufactured by KOJUNDO CHEMICAL LABORATORY CO., LTD. and having a purity of 99.999%) to a thickness of 150 nm.

Thereafter, the stack composed of the transparent substrate, the positive electrode, the hole transport layer, the light-emitting layer, the electron injection layer, and the negative electrode, was transported without air exposure into a glove box having a dry nitrogen atmosphere having a dew point of −80° C. or lower. Meanwhile, a seal cap made of glass was prepared, a water-absorbing agent (manufactured by DYNIC CORPORATION) was attached to the inner surface of the seal cap, and a sealing agent made of an ultraviolet-cured resin was applied to the edge of the opening of the seal cap. In the glove box, the seal cap was attached to the transparent substrate with the sealing agent so as to cover the whole of the positive electrode, the hole transport layer, the light-emitting layer, the electron injection layer, and the negative electrode. Thereafter, sealing was completed by curing the sealing agent by ultraviolet irradiation to produce an organic EL device having a configuration according to the organic EL device 2 shown in FIG. 2 and further including a hole transport layer and an electron injection layer that are respectively provided between the transparent electrode 22 and the light-emitting layer 23 and between the electrode 24 and the light-emitting layer 23.

Example 2

A substrate with a transparent conductive layer and an organic EL device were produced in the same manner as in Example 1, except that the non-conductive region was formed by applying fiber laser scanning light with a pulse energy intensity of 1.0 J/cm² by pulse irradiation.

Comparative Example 1

A substrate with a transparent conductive layer and an organic EL device were produced in the same manner as in Example 1, except that a 750-nm wavelength femtosecond laser was used instead of the fiber laser for patterning of the non-conductive region, and that the non-conductive region was formed by applying scanning light with a pulse energy intensity of 1.0 J/cm² by pulse irradiation.

Comparative Example 2

A substrate with a transparent conductive layer and an organic EL device were produced in the same manner as in Example 1, except that a 750-nm wavelength femtosecond laser was used instead of the fiber laser for patterning of the non-conductive region, and that the non-conductive region was formed by applying scanning light with a pulse energy intensity of 3.0 J/cm² by pulse irradiation.

Evaluation Method and Evaluation Result

For the substrates with the transparent conductive layers of Examples 1 and 2 and Comparative Examples 1 and 2, the optical properties (total light transmittance and haze value) of the non-conductive region and the optical properties (total light transmittance and haze value) of the conductive region were measured by a haze meter (manufactured by NIPPON DENSHOKU INDUSTRIES CO., LTD.). The optical characterization of the conductive region was carried out for the transparent conductive layer yet to be subjected to the laser irradiation for forming the non-conductive region. The total light transmittances and haze values are shown in Table 1.

The properties of the organic EL devices produced using the substrates with the transparent conductive layers of Examples 1 and 2 and Comparative Examples 1 and 2 were evaluated using a DC power supply (manufactured by Keithley Instruments) and a luminance meter (manufactured by TOPCON CORPORATION) under the conditions that the light-emitting area was 2 mm×2 mm and the current flowing in the device was fixed at 2 mA/cm². At this time, the front luminance was measured together with the current efficiency (cd/A) over the angular range of −80° to +80° at intervals of 10°, and the total luminous flux (power efficiency (lm/W)) was calculated. The measurement results of the current efficiency and the power efficiency are shown in Table 2.

TABLE 1

|  | Conductive region | Non-conductive region | | | |
| --- | --- | --- | --- | --- | --- |
|  |  | Example 1 | Example 2 | Comparative Example 1 | Comparative Example 2 |
| Haze value [%] | 4.7 | 5.4 | 5.1 | 4.0 | 3.2 |
| Total light transmittance [%] | 83.2 | 82.3 | 82.2 | 86.5 | 88.0 |

TABLE 2

|  | Example 1 | Example 2 | Comparative Example 1 | Comparative Example 2 |
| --- | --- | --- | --- | --- |
| Current efficiency [cd/A] | 11.2 | 11.1 | 10.5 | 10.3 |
| Power efficiency [lm/W] | 6.2 | 6.1 | 5.5 | 5.5 |

As shown in Table 1, in the substrates with the transparent conductive layers of Examples 1 and 2, the haze value of the non-conductive region was larger than the haze value of the conductive region. That is, by the laser irradiation of Examples 1 and 2, a non-conductive region having a higher haze value than a conductive region (portion not subjected to laser irradiation) was able to be formed, and thus a non-conductive region that exhibits high scattering effect was obtained. This is thought to be because in the non-conductive region, the silver nanowires were not completely disappeared but remained in the form of fine particles having the capability of exhibiting high scattering effect.

By contrast, in the substrates with the transparent conductive layers of Comparative Examples 1 and 2, the haze value of the non-conductive region was smaller than the haze value of the conductive region. That is, it can be thought that by the laser irradiation of Comparative Examples 1 and 2, the silver nanowires in the non-conductive region that was a portion subjected to laser irradiation were almost completely disappeared, and thus the haze value in the non-conductive region was reduced compared to the conductive region that was a portion not subjected to laser irradiation. Therefore, the substrates with the transparent conductive layers of Examples 1 and 2 are more capable than the substrates with the transparent conductive layers of Comparative Examples 1 and 2 of allowing a larger amount of light propagated laterally in the transparent conductive layer to be scattered in the non-conductive region. This is evident also from the results shown in Table 2, which reveals that the current efficiency and the power efficiency of the organic EL devices of Examples 1 and 2 were greatly improved compared to those of the organic EL devices of Comparative Examples 1 and 2.

INDUSTRIAL APPLICABILITY

The substrate with the transparent conductive layer of the present invention is useful as an electrode substrate for light-emitting devices. For example, the substrate with the transparent conductive layer is useful as an electrode substrate for organic EL devices.

The invention claimed is:

1. A substrate with a transparent conductive layer, comprising:
a substrate; and
a transparent conductive layer disposed on the substrate, wherein
the transparent conductive layer has a conductive region and a non-conductive region,
the conductive region and the non-conductive region each contain conductive fine particles and a resin matrix, and
a haze value in the non-conductive region is larger than a haze value in the conductive region.
2. The substrate with the transparent conductive layer according to claim 1, wherein
the conductive fine particles in the conductive region and the conductive fine particles in the non-conductive region are made of the same material, and the conductive fine particles in the non-conductive region have a smaller aspect ratio than the conductive fine particles in the conductive region.

3. The substrate with the transparent conductive layer according to claim 1, wherein a percentage of a volume occupied by the conductive fine particles in the non-conductive region to a volume occupied by the conductive fine particles in the conductive region is 1% or more and 50% or less.

4. The substrate with the transparent conductive layer according to claim 1, wherein the conductive fine particles in the conductive region are silver nanowires.

5. An organic electroluminescence device comprising:
the substrate with the transparent conductive layer according to claim 1;
an electrode disposed opposite the transparent conductive layer formed on the substrate; and
a light-emitting layer disposed between the transparent conductive layer and the electrode.

* * * * *